(12) United States Patent
Iwata et al.

(10) Patent No.: US 7,332,765 B2
(45) Date of Patent: Feb. 19, 2008

(54) VARIABLE RESISTANCE FUNCTIONAL BODY AND STORAGE DEVICE

(75) Inventors: Hiroshi Iwata, Nara-ken (JP); Nobutoshi Arai, Nara-ken (JP)

(73) Assignee: Sharp Kabushiki Kaisha, Osaka-shi, Osaka (JP)

( * ) Notice: Subject to any disclaimer, the term of this patent is extended or adjusted under 35 U.S.C. 154(b) by 0 days.

(21) Appl. No.: 10/926,151

(22) Filed: Aug. 26, 2004

(65) Prior Publication Data

US 2005/0151127 A1    Jul. 14, 2005

(30) Foreign Application Priority Data

Aug. 28, 2003    (JP)    ............ P2003-304633

(51) Int. Cl.
*H01L 29/76*    (2006.01)
(52) U.S. Cl. ............ 257/314; 257/2; 977/774
(58) Field of Classification Search ......... 257/17, 257/24, 20, 314, 2–4, 530, 536; 365/185, 365/184; 977/773, 774
See application file for complete search history.

(56) References Cited

U.S. PATENT DOCUMENTS 6,211,531 B1 * 4/2001 Nakazato et al. ............ 257/28
6,548,825 B1 * 4/2003 Yoshii et al. ............ 257/24
2004/0180491 A1    9/2004 Arai et al.
2004/0183647 A1    9/2004 Arai et al.

FOREIGN PATENT DOCUMENTS

JP          2000-22005 A         1/2000
WO    WO-2004/0027877 A1    4/2004

\* cited by examiner

*Primary Examiner*—Matthew C. Landau
(74) *Attorney, Agent, or Firm*—Birch, Stewart, Kolasch & Birch, LLP (57) ABSTRACT

A variable resistance functional body has an insulator interposed between a first electrode and a second electrode and interposed between a third electrode and a fourth electrode. The insulator contains a plurality of conductive particles. The conductive particles are formed by implanting a substance for forming the conductive particles into the insulator by the negative ion implantation method. The conductive particles are provided so that an electrical resistance between the third electrode and the fourth electrode changes on the basis of a size effect or a change in size between before and after application of a prescribed voltage across the first electrode and the second electrode.

17 Claims, 4 Drawing Sheets

VARIABLE RESISTANCE FUNCTIONAL BODY AND STORAGE DEVICE

CROSS-REFERENCE TO RELATED APPLICATIONS

This Nonprovisional application claims priority under 35 U.S.C. §119(a) on Patent Application No. 2003-304633 filed in Japan on 28 Aug. 2003, the entire contents of which are incorporated herein by reference.

BACKGROUND OF THE INVENTION

The present invention relates to a resistance element referred to as a "variable resistance functional body" whose electrical resistance changes between before and after application of a voltage and a manufacturing method therefor. This invention also relates to a storage device provided with such the variable resistance functional body.

In recent years, there have been proposed memory devices (single electron transistor and single electron memory) which are each provided with a nanometer-size particle called a nanodot and a nanocrystal in an insulator in order to store information through the use of, for example, a charge storage effect (refer to a patent document JP 2000-22005 A).

However, the memory devices of this kind require very fine processing in order to produce a nanosize dot capable of storing one or several electrons and to detect the flow of several electrons. The very fine processing makes it difficult to integrate them. Moreover, it has often been required to provide an extremely low temperature in order to restrain the occurrence of malfunction due to thermal fluctuation. For the above reasons, the memory devices that employ nanosize dots have poor practicability and still remain at the experimental level.

Moreover, in forming many nanodots, it is required to repeat same processes many times by using the CVD (Chemical Vapor Deposition) method or to grow particles by using the thermal annealing method. However, the particles formed by using those methods also have such problems that the particles have poor thermal stability and often have characteristics hardly applicable to normal silicon processes.

On the other hand, there has not yet been known a resistance element in which many conductive particles are produced at a time and the conductive particles are nanosize particles (nanodots) excellent in thermal stability.

SUMMARY OF THE INVENTION

An object of the present invention is to provide a variable resistance functional body, which is a resistance element provided with a nanodot excellent in thermal stability and of which the electrical resistance changes between before and after application of a low voltage.

Another object of this invention is to provide a manufacturing method for the variable resistance functional body.

Yet another object of this invention is to provide a storage device provided with the variable resistance functional body.

In order to solve the aforementioned problems, the present invention provides a variable resistance functional body comprising:

an insulator interposed between a first electrode and a second electrode and interposed between a third electrode and a fourth electrode which are provided separately from the first and second electrodes; and
a plurality of conductive particles arranged in the insulator and provided so that an electrical resistance between the third electrode and the fourth electrode changes on the basis of a size effect or a change in size between before and after applying a prescribed voltage across the first electrode and the second electrode.

According to this invention, by flowing a current between the first electrode and the second electrode, one to several electric charges are accumulated in a certain conductive particle in the vicinity of a current path or in the current path. The accumulated electric charges in the conductive particle exert a Coulomb interaction on the electrons in the current path. Therefore, the electrical resistance between the third and fourth electrodes changes in accordance with the presence or absence or the amount of electric charges accumulated in the conductive particle.

It is to be noted that the "conductive particle" means a particle made of material having conductivity. Therefore, the "conductive particles" include those constructed of a metal or semiconductor, and further include those constructed of an organic substance so long as they have conductivity. Moreover, the "particle" means a particle that has a particle diameter smaller than 1 μm.

The expression "a resistance changes on the basis of a size effect or a change in size" naturally includes the case where the electrical resistance is changed by a change in the "Coulomb interaction" retained in the conductive particle due to the "size effect." Also, the above expression includes the case where the electrical resistance is changed by "a change in size."

Further, the variable resistance functional body of the present invention allows the magnitude of the flowing current to be changed by electrical control with a comparatively low voltage at normal temperature. Therefore, the variable resistance functional body can be used as a memory having practicability.

In one embodiment of the present invention,
the insulator is formed in a layer form,
the first electrode and the second electrode are placed to hold the insulator from both sides in a thickness direction,
the third electrode and the fourth electrode are placed to hold the insulator from both sides in a layer direction perpendicular to the thickness direction, and
the conductive particles are uniformly distributed in the layer direction of the insulator and distributed within a certain range in the thickness direction of the insulator.

In the variable resistance functional body of this one embodiment, the conductive particles are distributed within a certain range in the thickness direction of the insulator. Therefore, the current is restrained from becoming extremely hard to flow or extremely easy to flow in the thickness direction of the insulator between the first electrode and the second electrode. This stabilizes a change of the electrical resistance between the third electrode and the fourth electrode provided on both sides in the layer direction of the insulator. Thereby, the variable resistance functional body obtains stable characteristics.

In one embodiment of the present invention, a concentration of an element constituting the conductive particles is maximized in a certain position of the insulator and reduced away from the certain position in the thickness direction.

In the variable resistance functional body of this one embodiment, as in the case of the above-stated, the current is restrained from becoming extremely hard to flow or extremely easy to flow in the thickness direction of the insulator between the first electrode and the second electrode. As a result, the variable resistance functional body obtains stable characteristics.

In one embodiment of the present invention, a density of the conductive particles is maximized in a certain position of the insulator and reduced away from the position in the thickness direction.

In the variable resistance functional body of this one embodiment, as in the case of the above-stated, the current is restrained from becoming extremely hard to flow or extremely easy to flow in the thickness direction of the insulator between the first electrode and the second electrode. Thereby, the variable resistance functional body obtains stable characteristics.

In one embodiment of the present invention, a particle diameter of the conductive particles is maximized in a certain position of the insulator and reduced away from the position in the thickness direction.

In the variable resistance functional body of this one embodiment, as in the case of the above-stated, the current is restrained from becoming extremely hard to flow or extremely easy to flow in the thickness direction of the insulator between the first electrode and the second electrode. Thereby, the variable resistance functional body obtains stable characteristics.

As described above, if particles of a plurality of sizes are used as the conductive particles, it becomes possible to divide into generally two group of the particles in roles: particles that mainly bear the role of electrical conduction and the particles that bear the role of retaining electric charges and changing the electrical resistance, and excellent operational stability can be obtained.

In one embodiment of the present invention, the insulator contains the conductive particles having a particle diameter of not smaller than 0.2 nm and smaller than 4 nm.

In the variable resistance functional body of this one embodiment, the insulator contains conductive particles of a particle diameter smaller than 4 nm. Therefore, hysteresis appears in the current-to-voltage (I-V) characteristic. Thereby, the electrical resistance between the third and fourth electrodes is largely changed. Furthermore, the insulator contains conductive particles of a particle diameter of not smaller than 0.2 nm. Therefore, the film thickness of the insulator can be maintained within a range in which the memory device is functional.

In one embodiment of the present invention, the insulator has a film thickness of not smaller than 2 nm and smaller than 50 nm.

According to the variable resistance functional body of this one embodiment, since the film thickness of the insulator is smaller than 50 nm, a current can be flowed between the first and second electrodes. Moreover, since the film thickness of the insulator is not smaller than 2 nm, there is neither the possibility of the tunneling of electric charge between the first and second electrodes nor the possibility of the occurrence of short circuit due to the conductive particles, so that the insulator can operate as a resistance element.

The present invention also provides a method for manufacturing a variable resistance functional body comprising:
an insulator interposed between a first electrode and a second electrode and interposed between a third electrode and a fourth electrode which are provided separately from the first and second electrodes; and
a plurality of conductive particles arranged in the insulator and provided so that an electrical resistance between the third electrode and the fourth electrode changes on the basis of a size effect or a change in size between before and after applying a prescribed voltage across the first electrode and the second electrode, the method comprising the steps of:
forming one of the first electrode and the second electrode;
forming the insulator on the one formed electrode; and
implanting a substance for forming the conductive particles into the insulator by negative ion implantation.

According to the method for manufacturing the variable resistance functional body of the present invention, a substance for forming the conductive particles is implanted into the insulator formed on one of the first electrode and the second electrode. Therefore, it is possible to distribute the conductive particles in the thickness direction of the insulator so that the electric resistance between the first and second electrodes is changed by the size effect. As a result, once the ion planting allows the conductive particles having the desired function to be formed in a short time with high productivity.

As a method for forming conductive particles in an insulator, there can be considered CVD, vapor deposition, MBE (Molecular Beam Epitaxy) and so on. However, these methods cannot form the conductive particles on one plane through one-time processing. Therefore, Those methods are required to repeat the processing many times in order to distribute the conductive particles in the thickness direction of the insulator, which leads to poor productivity.

Moreover, when conductive particles are formed in the insulator by the above-stated ion implantation, the concentration of the element constituting the conductive particles and the density and particle diameter of the conductive particles can be maximized in a certain position in the thickness direction of the insulator, and can be reduced on both sides of the position in the thickness direction. Therefore, the characteristics of the thus-obtained variable resistance functional body are stabilized.

Furthermore, the negative ion implantation is employed as an ion implantation. Therefore, the electrical charging of the insulator or the first and second electrodes supporting the insulator is restrained during implantation. Therefore, the implantation energy is accurately controlled to restrain variations in implantation. Moreover, since the electrical charging is restrained, the restrained electrical charging restrains the insulator from being destroyed to cause a defect. For the above reasons, a highly reliable variable resistance functional body is obtained.

In one embodiment of the present invention, the manufacturing method further comprises the step of carrying out hydrogen sintering after the negative ion implantation.

In the manufacturing method of the variable resistance functional body according to this one embodiment, electric charge trapping factors other than the particles, such as an interface state, are restrained by execution of hydrogen sintering after the negative ion implantation. Therefore, the operation characteristics of the produced variable resistance functional body are stabilized, and the reliability is improved. If the hydrogen sintering is carried out at a temperature of not lower than 500° C. in the above case, the hydrogen sintering is to concurrently carry out heat treatment for the repair of defects by the hydrogen sintering.

In one embodiment of the present invention, the manufacturing method further comprises the step of carrying out heat treatment at a temperature of not lower than 500° C. after completion of the negative ion implantation.

In the manufacturing method of the variable resistance functional body according to this one embodiment, the defects in the insulator can be reduced by carrying out heat treatment at a temperature of not lower than 500° C. Therefore, the electrical characteristics of the produced variable resistance functional body are improved, stabilizing the characteristics and improving the reliability.

The present invention provides a storage device comprising the above-stated variable resistance functional body.

The storage device of this invention is constructed more compact than in the conventional case because the storage device employs the variable resistance functional body having conductive particles as stated above. The aforementioned variable resistance functional body becomes operable with a comparatively low voltage.

In the storage device of one embodiment, at least two layers of the resistance-changing function bodies are stacked in a direction perpendicular to a substrate.

In the storage device of this one embodiment, at least two resistance-changing function bodies are three-dimensionally integrated because they are stacked in the direction perpendicular to the substrate. Therefore, a substantial reduction in the effective occupation area can be achieved, which makes it possible to increase the memory capacity.

The present invention provides a method for manufacturing a storage device having a variable resistance functional body comprising:
an insulator interposed between a first electrode and a second electrode and interposed between a third electrode and a fourth electrode which are provided separately from the first and second electrodes; and
a plurality of conductive particles arranged in the insulator and provided so that an electrical resistance between the third electrode and the fourth electrode changes on the basis of a size effect or a change in size between before and after applying a prescribed voltage across the first electrode and the second electrode, the method comprising the steps of:
forming the third electrode, the insulator and the fourth electrode so that these members are arranged in this order along the surface of a substrate;
forming a memory insulator by implanting a substance for forming the conductive particles in the insulator by the negative ion implantation method; and
forming a first electrode on the memory insulator.

The present invention also provides a memory having a variable resistance functional body comprising:
an memory insulator interposed between a first electrode and a second electrode and interposed between a third electrode and a fourth electrode which are provided separately from the first and second electrodes; and
a plurality of conductive particles arranged in the memory insulator and provided so that an electrical resistance between the third electrode and the fourth electrode changes on the basis of a size effect or a change in size between before and after applying a prescribed voltage across the first electrode and the second electrode, the method comprising the steps of:
forming an insulator on a surface of a substrate
forming the memory insulator from the insulator by implanting a substance for forming the conductive particles into the insulator with use of a negative ion implantation method; and
forming the third electrode and the fourth electrode such that the third electrode and the fourth electrode are put in contact with both sides of the memory insulator, and forming the first electrode on the memory insulator.

According to the method for manufacturing the memory of this invention, the negative ion implantation method allows conductive particles to be formed at only onetime in the insulator at a prescribed density (high density), and to be appropriately distributed in the thickness direction of the insulator. Thereby, the magnitude of the current flowing through the variable resistance functional body changes between before and after application of a prescribed voltage across a first electrode and the substrate used as a second electrode. Therefore, the storage device can be produced with good productivity.

There can be considered other methods for forming conductive particles in an insulator, such as a method for depositing a conductive substance by CVD (Chemical Vapor Deposition), vapor deposition, MBE (Molecular Beam Epitaxy) or the like and thereafter carrying out heat treatment to form conductive particles, or a method for depositing a conductive film and thereafter using a fine processing technique such as photolithography and etching. However, it is difficult for these methods to form conductive particles in the insulator at a prescribed density (high density) such that the charge blocking effect appears. Moreover, since the conductive particles can be formed only on one plane through one-time processing, it is required to repeat the processing many times in order to distribute the conductive particles in the thickness direction of the insulator so that the charge blocking effect appears, and this leads to poor productivity. In contrast to this, conductive particles can be formed at a high density in the insulator in a short time through one-time processing according to the ion implantation, and the conductive particles can be distributed in the thickness direction of the insulator. Moreover, according to the ion implantation, there is needed no fine processing technique such as photolithography and etching in order to form conductive particles. Therefore, the method according to the present invention exhibits excellent productivity.

In the case that conductive particles are formed in the insulator by the ion implantation according to the present invention, a low-concentration region of the element constituting the conductive particles and a high-concentration region thereof can be continuously formed in the produced variable resistance functional body in the thickness direction of the insulator. Also, a low-density region of the conductive particles and a high density region thereof can be continuously formed in the thickness direction of the insulator. Further, a region of the small-size conductive particles and a region of the large-size conductive particles can be continuously formed in the thickness direction of the insulator. If the above-mentioned states are provided, the characteristics of the variable resistance functional body are stabilized as already described.

Moreover, by using the negative ion implantation method, the insulator and the substrate supporting the insulator are restrained from being electrically charged during the implantation. Therefore, the implantation energy can be accurately controlled, and variations in implantation can be restrained. Moreover, since the electric charging is restrained, the insulator can be restrained from being destroyed by the electrical charging and from causing a defect. For the above reasons, the reliability of the produced variable resistance functional body is improved.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

This invention will be described in detail below on the basis of the embodiments thereof shown in the drawings.

Figure 1:
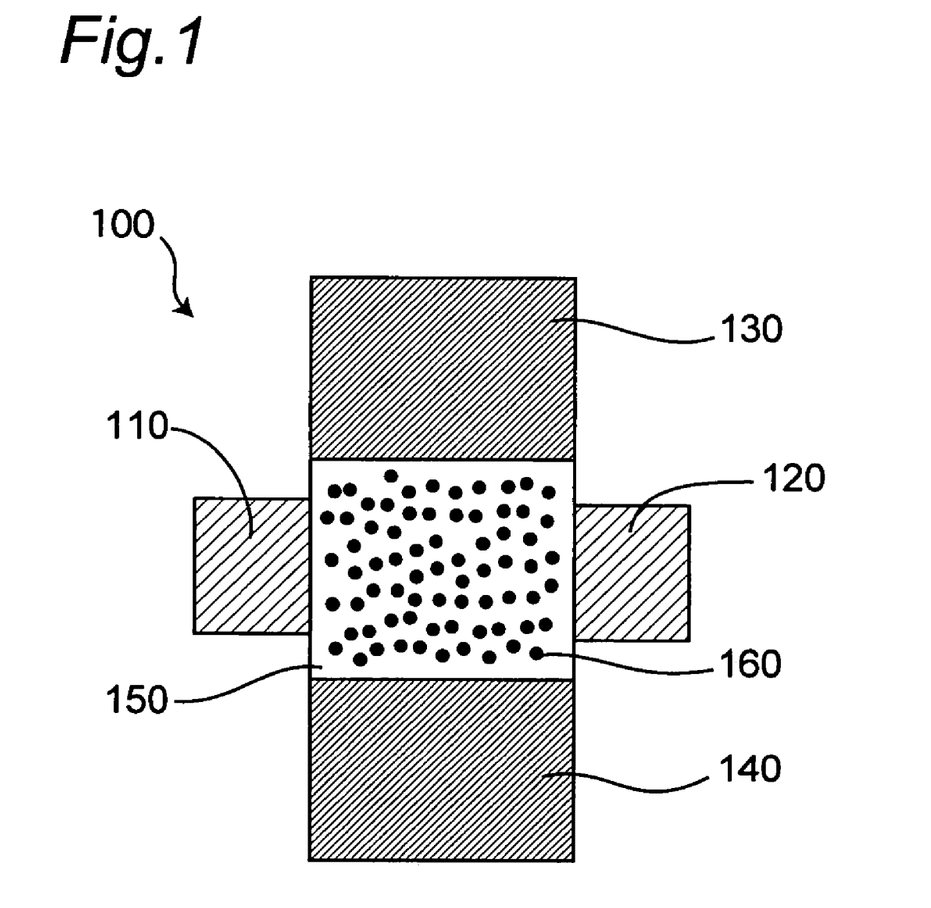
FIG. 1 is a view showing the schematic cross-sectional structure of a variable resistance functional body according to one embodiment of this invention.

FIG. 1 shows a schematic cross-sectional structure of a variable resistance functional body according to one embodiment of the present invention. The variable resistance functional body 100 is provided with an insulator 150. The insulator 150 is interposed between a first electrode 130 and a second electrode 140, and also between a third electrode 110 and a fourth electrode 120 which are provided separately from the first and second electrodes 130 and 140. Specifically, the first electrode 130 and the second electrode 140 are put in contact with the insulator 150 in the vertical direction of the figure. On the other hand, the third electrode 110 and the fourth electrode 120 are put in contact with the insulator 150 in the horizontal direction of the figure. The insulator 150 contains a plurality of conductive particles 160. The conductive particles 160 are arranged so that an electrical resistance between the third electrode 110 and the fourth electrode 120 changes on the basis of a size effect between before and after application of a prescribed voltage across the first electrode 130 and the second electrode 140. In this example, a silicon oxide is used as material of the insulator 150, while silver particles having a diameter smaller than 1 μm are used as the conductive particles 160. The conductive particles 160 have roughly uniform particle diameters and are distributed roughly uniformly throughout the whole region of the insulator 150.

In this variable resistance functional body 100, as stated above, the electrical resistance between the third electrode 110 and the fourth electrode 120 changes on the basis of the size effect of the conductive particles 160 between before and after application of the prescribed voltage across the first electrode 130 and the second electrode 140. This change in resistance is derived from the arrangement of the plurality of conductive particles 160 in the insulator 150. That is, by flowing a current between the first electrode 130 and the second electrode 140, one to several electric charges are accumulated in a certain conductive particle existing in the vicinity of a current path or in the current path. The accumulated electric charges exert Coulomb interactions on the electrons in the current path. Therefore, the electrical resistance between the third and fourth electrodes 110 and 120 changes in accordance with the presence or absence or the amount of electric charges accumulated in the conductive particles 160.

Figure 2:
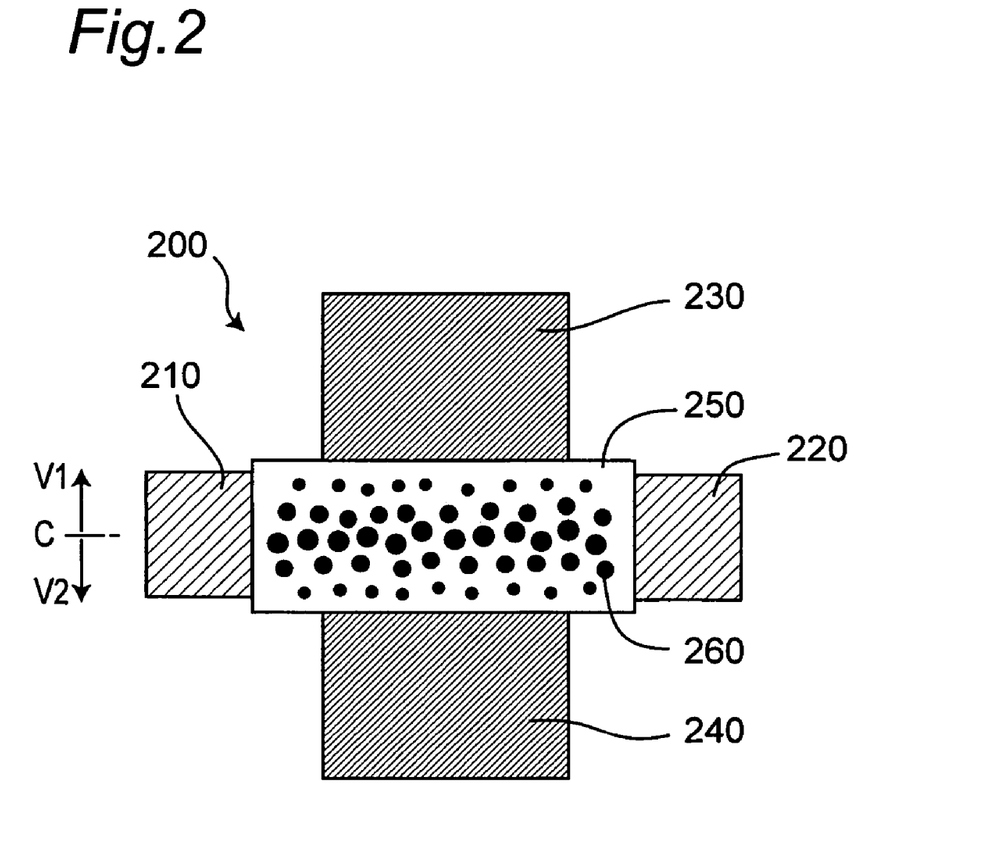
FIG. 2 is a view showing the schematic cross-sectional structure of a variable resistance functional body according to another embodiment of this invention.

FIG. 2 shows a schematic cross-sectional structure of a variable resistance functional body of a more preferable embodiment of the present invention. Similarly to the variable resistance functional body 100 of FIG. 1, this variable resistance functional body 200 is provided with an insulator 250, which is interposed between a first electrode 230 and a second electrode 240 and interposed between a third electrode 210 and a fourth electrode 220 provided separately from the first and second electrodes 230 and 240. In this example, the insulator 250 is formed in a layer form.

The first electrode 230 and the second electrode 240 are provided on both sides V1 and V2 in the thickness direction (vertical direction of the figure) of the insulator 250. The third electrode 210 and the fourth electrode 220 are provided on both sides in the layer direction (horizontal direction of the figure) of the insulator 250 perpendicularly to the thickness directions V1 and V2.

The insulator 250 contains a plurality of conductive particles 260, which are arranged so that an electrical resistance between the third electrode 210 and the fourth electrode 220 changes on the basis of the size effect between before and after application of a prescribed voltage across the first electrode 230 and the second electrode 240. In this example, similarly to the foregoing example, a silicon oxide is used as the material of the insulator 250, while silver particles having a diameter smaller than 1 μm are used as conductive particles.

The conductive particles 260 are not only uniformly distributed in the layer direction of the insulator 250, but also distributed within a certain range in the thickness direction of the insulator 250. This arrangement restrains a current from becoming extremely hard to flow or extremely easy to flow in the thickness direction of the insulator 250 between the first electrode 230 and the second electrode 240. Therefore, a change in the electrical resistance between the third electrode 210 and the fourth electrode 220 provided on both sides in the layer direction of the insulator 250 is stabilized. As a result, stable characteristics are obtained.

Moreover, as shown in FIG. 2, it is preferable to provide a structure in which the particles contained in the insulator 150 have at least two kinds of particle diameters. Thereby, electric charges can move along comparatively large particles when electric charges move between the third electrode 210 and the fourth electrode 220. On the other hand, the electric charges should move across comparatively small particles when the electric charges move between the first electrode 230 and the second electrode 240.

It is preferable that the concentration of the silver element that constitutes the conductive particles 260 is maximized in a certain position C in the insulator 250 and reduced away from the position C to the thickness directions V1 and V2. In the above case, the current is further restrained from becoming extremely hard to flow or extremely easy to flow in the thickness directions V1 and V2 of the insulator 250 between the first electrode 230 and the second electrode 240. As a result, further stabilized characteristics are obtained.

It is preferable that the density of the conductive particles 260 is maximized in a certain position C in the insulator 250 and reduced away from the position C to the thickness directions V1 and V2. Also, in the above case, the current is further restrained from becoming extremely hard to flow or extremely easy to flow in the thickness directions V1 and V2 of the insulator 250 between the first electrode 230 and the second electrode 240. As a result, further stabilized characteristics are obtained.

It is preferable that the particle diameter of the conductive particles 260 is maximized in a certain position C in the insulator 250 and reduced away from the position C to the thickness directions V1 and V2. Also, in the above case, the current is further restrained from becoming extremely hard to flow or extremely easy to flow in the thickness directions V1 and V2 of the insulator 250 between the first electrode 230 and the second electrode 240. As a result, further stabilized characteristics are obtained. If particles having a plurality of sizes are used as the conductive particles 260 as described above, it becomes possible to divide into generally two group of the particles in roles: particles that mainly bear the role of electrical conduction and particles that bear the role of retaining electric charge to change the electrical resistance. Thereby, excellent operational stability is obtained.

The variable resistance functional body 200 is formed as follows.

Figure 3A:
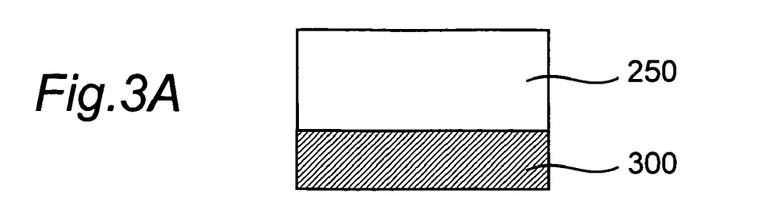
FIGS. 3A through 3E are a process chart showing a manufacturing method for producing the variable resistance functional body of FIG. 2.

First of all, as shown in FIG. 3A, a silicon oxide 250 is formed as an insulator on the surface of a silicon substrate 300 through a thermal oxidation process. In this case, the film thickness of the formed silicon oxide 250 is about 25 nm. It is to be noted that the silicon substrate 300 is used as the second electrode 240 of the variable resistance functional body 200.

Figure 3B:
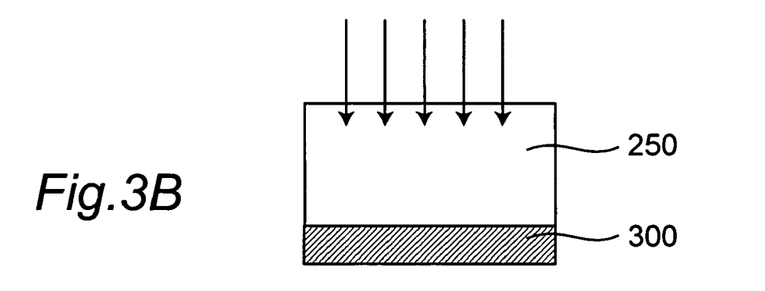

Next, as shown in FIG. 3B, silver is introduced as an element that constitutes the conductive particles into the silicon oxide 250 by the negative ion implantation method. In this case, if the implantation energy is extremely high, then the distribution of the implanted silver extremely spreads. This is not suitable for the implantation into the thin film of the silicon oxide 250, and the silicon oxide 250 is damaged to disadvantageously cause a defect. Therefore, the implantation energy should preferably be set smaller than 100 keV and more preferably be set smaller than 50 keV. By carrying out the implantation with energy of 15 keV, silver can be implanted to an intermediate depth of the silicon oxide 250.

Moreover, if the implantation dose is extremely large, then the particle diameter of the particles becomes extremely increased. Thereby, the damage of the silicon oxide 250 is increased. If the implantation dose is extremely small, then the particle density becomes extremely reduced. Therefore, the implantation dose should preferably be set greater than $1 \times 10^{12}/cm^2$ and smaller than $1 \times 10^{20}/cm^2$ and more preferably be set greater than $1 \times 10^{13}/cm^2$ and smaller than $1 \times 10^{17}/cm^2$. In the present embodiment, the implantation energy is set to about 15 keV, and the dose is set to about $1 \times 10^{15}/cm^2$.

Moreover, as described above, the negative ion implantation method is adopted as an ion implantation method in the present embodiment. When the implantation is carried out by using negative ions, the surface potential of the material (silicon oxide 250 in this example) that undergoes the implantation does not increase up to the acceleration voltage of positive ions, unlike in the case of positive ions, and the voltage settles to a very low value of about several volts.

That is, in the case of positive ion implantation, ions of positive charge are made incident on the material surface, and the secondary electrons of negative charge are discharged. Consequently, the material surface keeps being positively charged. Therefore, the voltage eventually rises up to the acceleration voltage of positive ions.

In contrast to this, in the case of negative ion implantation, ions of negative charge are made incident on the material surface, and the secondary electrons of negative charge are discharged. Consequently, positive charge is generated on the material surface, and the surface voltage settles within a range of about positive several volts to negative several volts. Therefore, an effective change in the acceleration voltage is reduced in comparison with the positive ion implantation, and this makes it possible to restrain variations in the implantation depth. Moreover, the silicon oxide 250 that undergoes the implantation and the silicon substrate 300 that supports it are scarcely charged. This therefore makes it possible to restrain the occurrence of defects due to dielectric breakdown and so on.

Figure 3C:
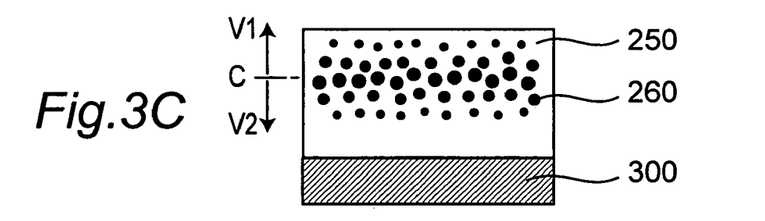

Next, as shown in FIG. 3C, heat treatment is carried out to condense or diffuse the implanted element ("silver" in the present embodiment). By once effecting sufficient diffusion or making the implantation distribution concentration gradient gradual in the foregoing implantation process, it is possible to roughly uniformly distribute the particles 160 throughout the whole region of the insulator 150 with a uniform particle diameter as in the example shown in FIG. 1. However, in order to provide a more preferable state as in the example shown in FIG. 2, the heat treatment is carried out in such an appropriate way that the implantation concentration distribution do not extremely spread. This arrangement allows the silver particles 260 to be formed in the silicon oxide 250 at a concentration such that either one or both of a particle diameter and a Coulomb force by which a remarkable size effect become effective. Also, the arrangement allows the silver particles 260 to be distributed within a certain range around a certain depth C as a center of the silicon oxide 250 in the thickness directions V1 and V2. Moreover, this can repair the defects which have occurred during the ion implantation.

The temperature of this heat treatment produces no effect when it is extremely low. On the other hand, it is impossible to form particles since the implanted element diffuses and melts when the temperature is extremely high. Therefore, it is preferable to set the heat treatment temperature higher than 200° C. and lower than the melting point of the implanted element. Moreover, the temperature effect is increased when the time of heat treatment is kept long even at a constant temperature. However, when the time of heat treatment is kept extremely long, it may be a case where the particle diameter becomes extremely large or a case where the implanted element disadvantageously diffuses outwardly of the region where the particles should be formed. Therefore, the heat treatment time should preferably be set shorter than 24 hours.

For example, when an ordinary heat treatment furnace is used, it is preferable to set the heat treatment temperature within a range of 300° C. to 1000° C. in an inert atmosphere of argon, nitrogen or the like. However, when silver is used as the material of the particles, silver is disadvantageously diffused roughly uniformly if heat treatment is carried out at an elevated temperature for a long time. Therefore, in this example, a ceramics electric tube furnace produced by Asahi Rika Manufacturing Co., Ltd. was used, and heat treatment was carried out at a temperature of about 600° C. for about one hour in an argon atmosphere.

Figure 3D:
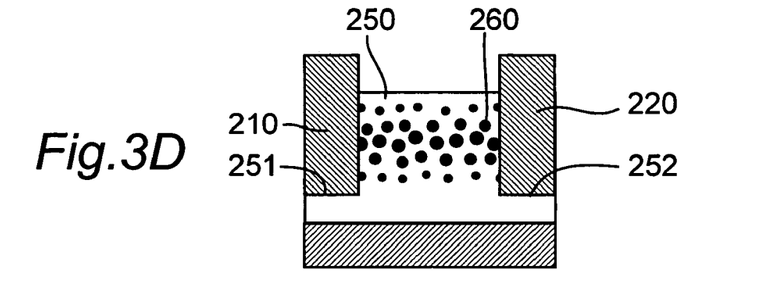
Figure 3E:
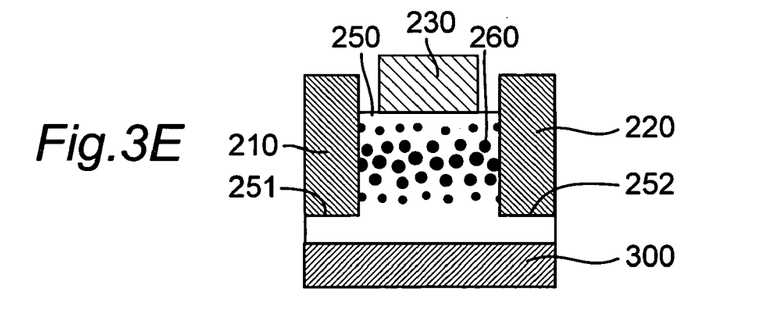

In the case where a material that has a higher melting point other than the aforementioned "silver", or for example, a conductive material of "gold" or the like is used as the particles 260, the particles 260 can be formed without being extremely diffused even through annealing at a high temperature of about 900° C. in the case of "gold" as shown in FIGS. 3C through 3E. However, in the case where similar particles are formed by using, for example, "silver", silver is disadvantageously diffused roughly uniformly if annealing is carried out at a temperature of about 900° C. Since the oxidation temperature of silicon, which is typically used in the semiconductor industry, is about 900° C., it is advantageous to use a high melting-point material as the particles 260 in terms of compatibility with the existing semiconductor processes.

After the silver particles 260 are appropriately distributed in the silicon oxide 250 as described above, grooves 251 and 252 are provided by etching on both sides (left and right sides in the figure) of the silicon oxide 250 in the layer direction as shown in FIG. 3D, such that the depth of the grooves 251 and 252 exceeds the distribution of the silver particles 260. Further, the third electrode 210 and the fourth electrode 220 are formed by burying the grooves 251 and 252 with a conductive material by vapor deposition or the like.

Moreover, as shown in FIG. 3E, the first electrode 230 is formed on the surface of the silicon oxide 250 by the vapor deposition method or the like.

As a result, the first electrode 230 and the silicon substrate 300 (or second electrode 240) are placed to hold the silicon oxide 250 from both sides in the thickness direction. Also, the third electrode 210 and the fourth electrode 220 are placed to hold the silicon oxide 250 from both sides in the layer direction.

The materials of the third electrode 210, the fourth electrode 220 and the first electrode 230 may also be made of a metal, a semiconductor or an organic substance so long as the material has conductivity. Gold was used in the present embodiment. Moreover, as a method for forming these electrodes, there can be adopted CVD (Chemical Vapor Deposition), vapor deposition, MBE (Molecular Beam Epitaxy) and so on.

Furthermore, it is preferable to carry out hydrogen sintering. By so doing, charge trapping factors of interface state and so on other than the particles 260 can be restrained, and the operation characteristics are stabilized, allowing the reliability to be improved. It is to be noted that, if the hydrogen sintering is carried out at a temperature of not lower than 600° C., it becomes possible to concurrently carry out heat treatment to repair the aforementioned defects and hydrogen sintering, and this is rather preferable for the reason that the processes can be simplified.

Figure 4:
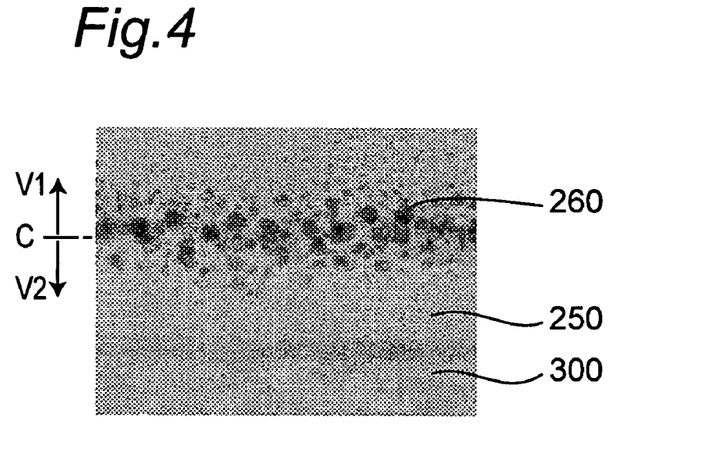
FIG. 4 is a photograph of a cross section of the variable resistance functional body of FIG. 2 observed by a TEM (Transmission Electron Microscope)

The cross section of the layered silicon oxide 250 containing the particles 260 of the variable resistance functional body 200 produced as described above was observed by a TEM (Transmission Electron Microscope). As a result, it was discovered that the implanted silver ions were condensed as shown in FIG. 4 to become nanometer-size particles 260 having a particle diameter of not greater than about 3 nm. Moreover, the particles 260 in the silicon oxide 250 were able to be distributed within a certain range centered about the depth C in the thickness directions V1 and V2, which depth is expected from the set implantation energy (acceleration energy of silver ions) That is, the concentration of the silver element that constitutes the conductive particles 260 was maximized in the position C of the insulator 250 and reduced away from the position C in the thickness directions V1 and V2. Moreover, the density of the conductive particles 260 was maximized in the position C of the insulator 250 and reduced away from the position C in the thickness directions V1 and V2. Furthermore, the particle diameter of the conductive particles 260 was maximized in the position C in the insulator 250 and reduced away from the position C in the thickness directions V1 and V2.

As described above, according to the ion implantation, the conductive particles 260 can be formed at high density in the insulator 250 within a short time through one-time processing, and the conductive particles 260 can be desirably distributed in the thickness directions V1 and V2 of the insulator 250. Moreover, according to the ion implantation, there is required no fine processing technique such as photolithography and etching in order to form the conductive particles 260. Therefore, the ion implantation is excellent in productivity.

Moreover, the substance for forming the conductive particles 260 in the insulator 250 is implanted by the negative ion implantation method in the present embodiment. Thereby, the insulator 250 and the silicon substrate 300 that supports it can be prevented from being electrically charged during implantation. Therefore, the implantation energy can be accurately controlled, and variations in the implantation can be restrained. Moreover, the electrical charging is restrained as described above, it is possible to prevent the destruction of the insulator 250 and the consequent occurrence of defects. As the result of the above, the reliability of the variable resistance functional body 200 can be improved.

Figure 5:
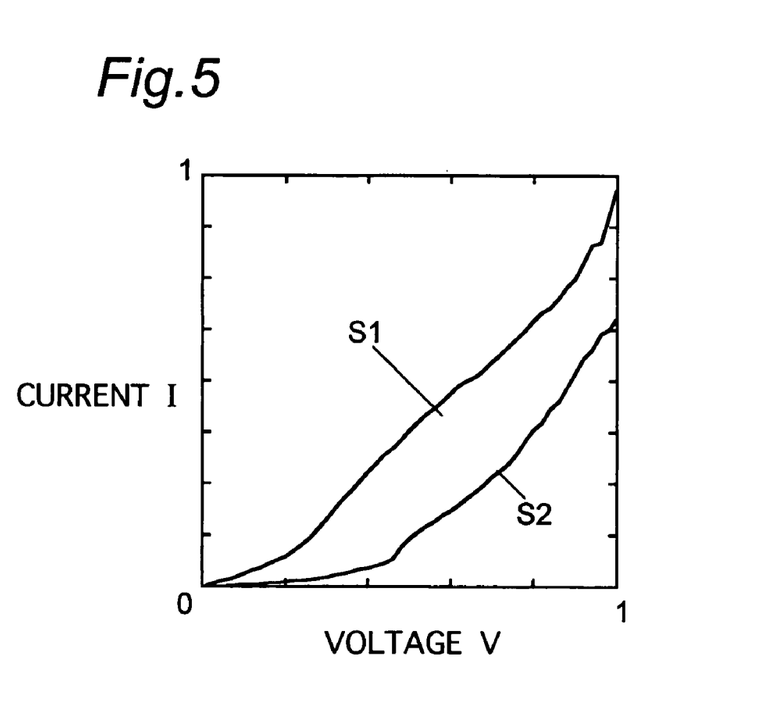
FIG. 5 is a graph showing the current-to-voltage (I-V) characteristic of the variable resistance functional body of FIG. 2 at normal temperature (25° C.).

FIG. 5 shows a graph of the current-to-voltage (I-V) characteristic at normal temperature (25° C.) of the variable resistance functional body 200 produced by the aforementioned method.

This characteristic was obtained by grounding the fourth electrode 220, applying a voltage to the third electrode 210 and observing the current that flowed through the third electrode 210. First of all, when the voltage was continuously changed from the lower side to the higher side, the current was increased as indicated by the characteristic data S1 in FIG. 5. Subsequently, a voltage of about 5 V was applied across the first electrode 230 and the second electrode 240, and thereafter, a voltage was applied again across the third electrode 210 and the fourth electrode 220 to similarly observe the current. Consequently, the current was decreased as indicated by the characteristic data S2 in FIG. 5. As is understood from FIG. 5, according to this current-to-voltage (I-V) characteristic, the current flowing between the third electrode 210 and the fourth electrode 220 after the application of the voltage across the first electrode 230 and the second electrode 240 is reduced with respect to any voltage within the measured voltage range. That is, the resistance is increased. This reason will be considered next.

According to the characteristic data S1 of FIG. 5, when the voltage is applied across the third electrode 210 and the fourth electrode 220, electric charges move, that is, a current flows mainly in the layer direction along the comparatively large particles existing through the central point C of thickness of the silicon oxide 250. Comparatively small particles are scattered in the regions remote, with respect to the thickness directions V1 and V2, from the large particles located in the vicinity of the center C. In these regions, there is less electric charges to be transferred to these small particles because the particles have smaller diameters, and also the interval between adjoining particles are separated farther than that between the particles existing in the vicinity of the center C.

Next, a situation will be considered when a voltage is applied across the first electrode 230 and the second electrode 240. At this time, if a voltage of not smaller than a certain voltage is applied, it can easily be understood that, tunneling through the surrounding oxide, electric charges are injected also into the comparatively small particles existing in the regions apart from the comparatively large particles located in the vicinity of the center C. When once electric charges are injected into these small particles, the electric charges are retained in the small particles. This situation is maintained even if the voltage application across the first electrode 230 and the second electrode 240 is stopped because the particles are surrounded by the insulator.

Here is considered a case where a voltage is applied again across the third electrode 210 and the fourth electrode 220 on this condition. At this time, electric charges are retained in the small particles as stated above. Those electric charges are expected to exert Coulomb interactions on the electric charges that try to move between the third electrode 210 and the fourth electrode 220 by transferring along the large particles located in the vicinity of the center C, and thus the Coulomb interactions obstruct the movement of the electric charges. That is, it is understood that the current flowing between the third electrode 210 and the fourth electrode 220 is restrained, and that the current is consequently reduced in comparison with the state of the characteristic data S1. That is, the electrical resistance is increased between the third electrode and the fourth electrode.

Moreover, the cause of the electrical resistance-changing can also be understood to be ascribed to a change in the Coulomb energy as a consequence of the diffusion and disappearance or the condensation and enlargement of the particles due to the influence of the current. It can otherwise be understood that the Coulomb energy has been changed as a consequence of the discharge of electrons from the particles due to a thermal energy ascribed to Joule heat.

This variable resistance functional body 200 may be used as a memory that discriminates binary data by reading the magnitude of current through change of resistance. Moreover, the variable resistance functional body of the present invention may also be referred to as a local charge retaining function body because of partial capturing of electric charges.

The current value was remarkably increased when an excessive voltage was applied across the third and fourth electrodes 210 and 220 or across the first and second electrodes 230 and 240 of the present variable resistance functional body 200. This is presumably ascribed to the change of the particles contained in the insulator or the occurrence of dielectric breakdown of the insulator existing between particles. It is more highly possible that the particles have been diffused or condensed by Joule heat or that the state of the particles has been changed by migration due to the current, because the insulator, which serves as a tunneling barrier, between the particles scarcely causes dielectric breakdown.

A normal fuse memory, which utilizes the dielectric breakdown of an insulation film, needs a high voltage to cause the dielectric breakdown of the insulation film. In contrast to this, the memory using the variable resistance functional body is capable of write operation executed with a voltage lower than that of the conventional fuse memory. This is because the substantial insulation film thickness between particles is thin in the variable resistance functional body, and a majority of insulation film thickness is capable of tunneling between the particles. In short, the present memory can be used at a low voltage instead of a fuse memory.

In a case where small particles are made to efficiently retain electric charge through the use of the Coulomb blockade effect as a sort of size effect, the energy necessary for separating the electric charge must be sufficiently larger than the thermal energy of the ambient temperature in consideration of the capacity of the particles, so that the Coulomb blockade effect becomes remarkable. For the above-mentioned purpose, it is estimated that the required radius of the particle might be about 0.5 nm to 1 nm when the particle is assumed to be a perfect conductor sphere. The Coulomb blockade effect itself becomes remarkable as the particle diameter of the particles 102 is reduced. However, the implantation of electric charge becomes difficult when the particle diameter of the particles is extremely small, and thus a high voltage and a reduction in the operation speed occur. Therefore, this arrangement is undesirable from the viewpoint of device application.

In the embodiment, negative ion implantation is carried out to form the conductive particles in the silicon oxide. Therefore, the silicon oxide after being produced had the same quality as that of a single thermal oxide film and came to have very high reliability. Moreover, the processing time is shortened in comparison with CVD and the like, assuring excellent productivity.

Moreover, according to the negative ion implantation, the variations in the particles due to the electrical charging can be suppressed as already described. Therefore, the distribution of the particles 260 can be restrained from varying in the thickness directions V1 and V2 of the silicon oxide 250. Therefore, the variable resistance functional body 200 can be formed into a thin film and allowed to be scaled down in size. When the variable resistance functional body is thus formed into a thin film, the effective electric field applied to the variable resistance functional body is strengthened even if the same voltage is applied across the first and second electrodes 230 and 240. Therefore, it becomes possible to lower the voltage for operating the variable resistance functional body, assuring excellent productivity and low power consumption.

As schematically shown in FIG. 2, the concentration of the silver element that constitutes the particles 260 in the silicon oxide 250 is not uniform. The regions of low concentrations of the silver element constituting the particles 260 continuously exist next to the region of high concentrations of the silver element in the thickness directions V1 and V2 of the silicon oxide 250. Also, the density of the particles 260 in the silicon oxide 250 is not uniform. The regions of low densities of the particles 260 continuously exist next to the region of high densities of the conductive particles 260 in the thickness directions V1 and V2 of the silicon oxide 250. Further, the size of the conductive particles 260 in the silicon oxide 250 is not uniform. The regions of small sizes of the particles 260 continuously exist next to the region of large sizes of the conductive particles 260 in the thickness directions V1 and V2 of the silicon oxide 250. In these cases, the current can be restrained from becoming extremely hard to flow or extremely easy to flow in the thickness directions V1 and V2 of the insulator 250, i.e., in the direction in which the first electrode 230 and the second electrode 240 are opposed to each other. Therefore, the characteristics of the variable resistance functional body are stabilized.

Moreover, if angled implantation is carried out during the negative ion implantation, the distribution of the particles 260 can be restrained from spreading in the thickness direction of the silicon oxide 250. Therefore, the variable resistance functional body can be formed into a thin film suitably for scale down in size.

In the aforementioned embodiment, the silicon oxide has been enumerated as the material of the insulator that contains conductive particles. However, it is possible to employ insulators of silicon nitride, aluminum oxide, titanium oxide and so on instead of the silicon oxide. However, if the insulator is a material of an extremely high dielectric constant, the capacity extremely increases to exert influence on the operation speed, also depending on the size of the conductive particles. Therefore, the insulator material containing conductive particles should preferably be a material that has a dielectric constant of not higher than ten or more preferably a low dielectric constant of not higher than four.

In the aforementioned embodiment, silver has been enumerated as the material that constitutes the conductive particles. However, it is also possible to employ other metals of gold, silver, copper, aluminum, tin, nickel, platinum, zinc, hafnium, manganese, tantalum, titanium, tungsten, indium, gallium and so on as the material that constitutes the conductive particles. Moreover, it is also possible to employ a semiconductor or a compound semiconductor of silicon, germanium or the like, and it is also possible to employ an alloy or another compound. Moreover, even a magnetic material can be used. It is to be noted that a single element is preferable since the implantation process is easy.

In the aforementioned embodiment, the silicon substrate 300 has been used as the second electrode 240. However, it is acceptable to employ a substrate constructed of a semiconductor or a metal material other than silicon. Moreover, it is acceptable to form a conductive layer on a substrate constructed of an insulator material of a glass substrate or the like by CVD (Chemical Vapor Deposition), vapor deposition, MBE (Molecular Beam Epitaxy) or the like and use the conductive layer as the second electrode.

A silicon film can be formed by epitaxial growth, polysilicon deposition, CGS (Continuous Grain Silicon) and so on. However, it is preferable to use polysilicon and CGS, which can be formed at a comparatively low temperature. It is rather preferable to employ CGS of good crystallinity in terms of improving the rectification performance and assuring excellent reliability. CGS is silicon that can be produced at a low temperature by the production method as described in JP 08-78329 A and so on. CGS has the advantages that the crystallinity is good and high mobility can be obtained in comparison with amorphous silicon that can be produced at low temperatures and low-temperature polysilicon other than CGS.

Moreover, the storage device (memory) provided with the variable resistance functional body 200 formed into a thin film as described above is constructed more compactly than in the conventional case. Moreover, an arrangement in which a plurality of the resistance-changing function bodies 200 are stacked in the direction perpendicular to the substrate can easily be provided. Therefore, the versatility of the memory is fostered.

The invention being thus described, it will be obvious that the invention may be varied in many ways. Such variations are not be regarded as a departure from the spirit and scope of the invention, and all such modifications as would be obvious to one skilled in the art are intended to be included within the scope of the following claims.

What is claimed is:

1. A variable resistance functional body, comprising:
   an insulator interposed between a first electrode and a second electrode and interposed between a third electrode and a fourth electrode which are provided separately from the first and second electrodes; and
   a plurality of conductive particles arranged in the insulator,
   wherein the arrangement of conductive particles in the insulator is such that upon applying a voltage across the third electrode and the fourth electrode a resulting current flow from the third electrode to the fourth electrode or vice versa within the insulator between the third electrode and the fourth electrode is changed based on current flow from the first electrode to the second electrode or vice versa due to a prescribed voltage applied across the first electrode and the second electrode.

2. The variable resistance functional body as claimed in claim 1, wherein
   the insulator is formed in a layer form,
   the first electrode and the second electrode are placed to hold the insulator from both sides in a thickness direction,
   the third electrode and the fourth electrode are placed to hold the insulator from both sides in a layer direction perpendicular to the thickness direction, and
   the conductive particles are uniformly distributed in the layer direction of the insulator and distributed within a certain range in the thickness direction of the insulator.

3. The variable resistance functional body as claimed in claim 2, wherein
   a concentration of an element constituting the conductive particles is maximized in a certain position of the insulator and reduced away from the certain position in the thickness direction.

4. The variable resistance functional body as claimed in claim 2, wherein
   a density of the of the conductive particles is maximized in a certain position of the insulator and reduced away from the position in the thickness direction.

5. The variable resistance functional body as claimed in claim 2, wherein
   a particle diameter of the conductive particles is maximized in a certain position of the insulator and reduced away from the position in the thickness direction.

6. The variable resistance functional body as claimed in claim 1, wherein
   the insulator contains the conductive particles having a particle diameter of not smaller than 0.2 nm and smaller than 4 nm.

7. The variable resistance functional body as claimed in claim 1, wherein
   the insulator has a film thickness of not smaller than 2 nm and smaller than 50 nm.

8. The variable resistance functional body as claimed in claim 1, wherein
   at least one of the particles is located between the third and fourth electrodes, and an electrical resistance between the third and fourth electrodes is changed in accordance with an amount of electric charges accumulated in another particle or in accordance with a size change of the at least one of the particles.

9. The variable resistance functional body as claimed in claim 1, wherein
   distribution of particle diameters of the particles is continuously changed in a thickness direction of the insulator.

10. The variable resistance functional body as claimed in claim 9, wherein
    the particle diameter is maximized in a certain position of the insulator in the thickness direction of the insulator and reduced away from the certain position toward both sides of the insulator.

11. The variable resistance functional body as claimed in claim 2, wherein
    the particles contained in the insulator have at least two kinds of particle diameters, the particles are distributed in the insulator in such a way that the electric charges moving between the third and fourth electrodes move along comparatively large particles, and that the electric charges moving between the first and second electrodes move across comparatively small particles.

12. The variable resistance functional body as claimed in claim 1, wherein
the particles contained in the insulator have at least two kinds of particle diameters,
a particle diameter of comparatively small particles is not less than 0.2 nm, and
a particle diameter of comparatively large particles is not more than 4 nm.

13. The variable resistance functional body as claimed in claim 1, wherein
the particles contained in the insulator have at least two kinds of particle diameters,
an average resistance rate per unit volume between the third electrode and the fourth electrode is smaller than an average resistance rate per unit volume between the first electrode and the second electrode.

14. The variable resistance functional body as claimed in claim 1, wherein
the particles contained in the insulator include comparatively large particles mainly bearing a role of electrical conduction and comparatively small particles mainly bearing a role of retaining electric charge.

15. The variable resistance functional body as claimed in claim 2, wherein
at least one particle of particles contained in the insulator contacts the third or fourth electrode and at least one other particle contacts none of the first to fourth electrodes.

16. A storage device having a variable resistance functional body, comprising:
an insulator interposed between a first electrode and a second electrode and interposed between a third electrode and a fourth electrode which are provided separately from the first and second electrodes; and
a plurality of conductive particles arranged in the insulator,
wherein the arrangement of conductive particles in the insulator is such that upon applying a voltage across the third electrode and the fourth electrode a resulting current flow from the third electrode to the fourth electrode or vice versa within the insulator between the third electrode and the fourth electrode is changed based on current flow from the first electrode to the second electrode or vice versa due to a prescribed voltage applied across the first electrode and the second electrode.

17. The storage device as claimed in claim 16, wherein
at least two layers of the variable resistance functional body are stacked in a direction perpendicular to a substrate.

* * * * *